US008382878B2

(12) United States Patent
Li

(10) Patent No.: US 8,382,878 B2
(45) Date of Patent: Feb. 26, 2013

(54) SILVER NANOPARTICLE PROCESS

(75) Inventor: Yuning Li, Mississauga (CA)

(73) Assignee: Xerox Corporation, Norwalk, CT (US)

(*) Notice: Subject to any disclaimer, the term of this patent is extended or adjusted under 35 U.S.C. 154(b) by 714 days.

(21) Appl. No.: 12/187,499

(22) Filed: Aug. 7, 2008

(65) Prior Publication Data
US 2010/0034693 A1 Feb. 11, 2010

(51) Int. Cl.
B22F 9/24 (2006.01)
B22F 9/18 (2006.01)

(52) U.S. Cl. .................................. 75/371; 75/343

(58) Field of Classification Search .................. 75/343, 75/351, 362–374, 392, 414, 416, 420–422, 75/426, 427, 631, 634–636, 710, 711, 717, 75/720–722, 724, 732, 733, 739, 741, 953; 420/501–506; B22F 9/16, 9/18, 9/20, 9/24, B22F 9/30
See application file for complete search history.

(56) References Cited

U.S. PATENT DOCUMENTS

| 4,353,741 | A | * | 10/1982 | Capuano et al. | 549/534 |
| 6,156,094 | A | * | 12/2000 | Hosokura | 75/343 |
| 7,270,694 | B2 | | 9/2007 | Li et al. | |
| 7,785,392 | B2 | * | 8/2010 | Shim et al. | 75/351 |
| 2006/0073667 | A1 | * | 4/2006 | Li et al. | 438/311 |

FOREIGN PATENT DOCUMENTS

| CA | 2521686 A1 | 4/2006 |
| EP | 1646095 A | 4/2006 |
| JP | 2004183009 A | 7/2004 |

OTHER PUBLICATIONS

Wu et al., "Printed Silver Ohmic Contacts for High-Mobility Organic Thin-Film Transistors", JACS [Online]—http://pubs.acs.org/doi/suppl/10.1021/ja058725w/suppl_file/ja058725wsi20060223_091555.pdf, vol. 128, Mar. 9, 2006, pp. 4202-4203 [retrieved on Sep. 8, 2009].

Li et al., "Facile Synthesis of Silver Nanoparticles Useful for Fabrication of High-Conductivity Elements for Printed Electronics", [online] http://pubs.acs.org/doi/suppl/10.1021/ja043425k, vol. 127, Feb. 18, 2005, pp. 3266-3267 [retrieved Sep. 8, 2009].

Seo et al., "Synthesis of Silver Nanoparticles by Chemical Reaction Method", Korean Chem. Eng. Res., vol. 42, No. 1, Feb. 2004, pp. 78-83. No translation available.

European Search Report dated Dec. 18, 2009.

* cited by examiner

Primary Examiner — Scott Kastler
Assistant Examiner — Vanessa Luk
(74) Attorney, Agent, or Firm — Zosan S. Soong; Fay Sharpe LLP

(57) ABSTRACT

A process comprising: (a) preparing a reaction mixture comprising a silver salt, the reducing agent comprising a hydrazine compound, a thermally removable stabilizer, and an optional solvent, to form a plurality of silver-containing nanoparticles with molecules of the stabilizer on the surface of the silver-containing nanoparticles, wherein the reaction mixture generates an acid; and (b) removing the acid to produce the silver-containing nanoparticles substantially free of acid.

15 Claims, No Drawings

SILVER NANOPARTICLE PROCESS

BACKGROUND OF THE INVENTION

Fabrication of electronic circuit elements using liquid deposition techniques is of profound interest as such techniques provide potentially low-cost alternatives to conventional mainstream amorphous silicon technologies for electronic applications such as thin film transistors (TFTs), light-emitting diodes (LEDs), RFID tags, photovoltaics, etc. However the deposition and/or patterning of functional electrodes, pixel pads, and conductive traces, lines and tracks which meet the conductivity, processing, and cost requirements for practical applications have been a great challenge. Silver is of particular interest as conductive elements for electronic devices because silver is much lower in cost than gold and it possesses much better environmental stability than copper. There is therefore a critical need, addressed by embodiments of the present invention, for lower cost methods for preparing liquid processable, stable silver-containing nanoparticle compositions that are suitable for fabricating electrically conductive elements of electronic devices.

The following documents provide background information:

Yuning Li et al., U.S. Pat. No. 7,270,694.

SUMMARY OF THE DISCLOSURE

In embodiments, there is provided a process comprising:
(a) preparing a reaction mixture comprising a silver salt, the reducing agent comprising a hydrazine compound, a thermally removable stabilizer, and an optional solvent, to form a plurality of silver-containing nanoparticles with molecules of the stabilizer on the surface of the silver-containing nanoparticles, wherein the reaction mixture generates an acid; and
(b) removing the acid to produce the silver-containing nanoparticles substantially free of acid.

In additional embodiments, there is provided a process comprising:
(a) preparing a reaction mixture comprising a silver salt, the reducing agent comprising a hydrazine compound, a thermally removable stabilizer, and an optional solvent, to form a plurality of silver-containing nanoparticles with molecules of the stabilizer on the surface of the silver-containing nanoparticles, wherein the reaction mixture generates an acid; and
(b) removing the acid to produce the silver-containing nanoparticles substantially free of acid by: (i) selecting the stabilizer that reacts with the acid; or (ii) adding a base that reacts with the acid; or (iii) both approaches (i) and (ii), wherein for approaches (i), (ii), and (iii), the stabilizer, or the base, or the combination of the stabilizer and the base is present in an amount effective for removing the acid to produce the silver-containing nanoparticles substantially free of the acid.

In further embodiments, there is provided a process comprising:
(a) preparing a reaction mixture comprising a silver salt, the reducing agent comprising a hydrazine compound, a thermally removable stabilizer, and an optional solvent, to form a plurality of silver-containing nanoparticles with molecules of the stabilizer on the surface of the silver-containing nanoparticles, wherein the reaction mixture generates an acid; and
(b) removing the acid to produce the silver-containing nanoparticles substantially free of the acid by reacting a base with the acid.

DETAILED DESCRIPTION

Suitable silver salts include organic and inorganic silver salts. In embodiments, the silver salts include silver acetate, silver propionate, silver butyrate, silver carbonate, silver nitrate, silver perchlorate, silver phosphate, silver trifluoroacetate, silver benzoate, silver lactate, silver acetylacetonate, silver bromate, silver bromide, silver chloride, silver citrate, silver fluoride, silver iodate, silver iodide, silver nitrite, silver sulfate, silver trifluoroacetate, and the like, or mixtures thereof in any suitable ratio.

The reducing agent for the silver salts includes a hydrazine compound. The hydrazine compound includes hydrazine and any suitable derivatives (substituted at one or both nitrogen atoms where each nitrogen atom can be substituted one or two times with the same or different substituent), as well as salts and hydrates of hydrazine and salts and hydrates of the hydrazine derivatives. It is understood that the representative compounds described herein for the hydrazine compound also include the hydrate form where applicable. For example, the compound "hydrazine" includes hydrazine hydrate and hydrazine not in hydrated form. Exemplary examples of the hydrazine compound are as follows:

Hydrazine ($H_2HNH_2$);

Hydrazine salt such as for example hydrazine tartrate, hydrazine monohydrobromide, hydrazine monohydrochloride, hydrazine dichloride, hydrazine monooxalate, and hydrazine sulfate.

Hydrocarbyl hydrazine (e.g., $RNHNH_2$ and RNHNHR and $RRNNH_2$) where one nitrogen atom is mono- or di-substituted with R, and the other nitrogen atom is optionally mono- or di-substituted with R, where each R is an independently selected hydrocarbon group such as methyl ethyl, propyl, butyl, hydroxyethyl, phenyl, benzyl, tolyl, bromophenyl, chloropehnyl, nitrophenyl, xylyl, and the like. Illustrative examples of hydrocarbyl hydrazine include for example, methylhydrazine, tert-butylhydrazine, 2-hydroxyethylhydrazine, benzylhydrazine, phenylhydrazine, tolylhydrazine, bromophenylhydrazine, chlorophenylhydrazine, nitrophenylhydrazine, 1,1-dimethylhydrazine, 1,1-diphenylhydrazine, 1,2-diethylhydrazine, and 1,2-diphenylhydrazine.

Hydrocarbyl hydrazine salt (which is a salt of the hydrocarbyl hydrazine described herein) such as for example methylhydrazine hydrochloride, phenylhydrazine hydrochloride, benzylhydrazine oxalate, butylhydrazine hydrochloride, butylhydrazine oxalate salt, and propylhydrazine oxalate salt.

Hydrazide (e.g., $RC(O)NHNH_2$ and RC(O)NHNHR' and RC(O)NHNHC(O)R) where one or both nitrogen atoms are substituted by an acyl group of formula RC(O), where each R is independently selected from hydrogen and a hydrocarbon group, and one or both nitrogen atoms are optionally mono- or di-substituted with R', where each R' is an independently selected hydrocarbon group. Illustrative examples of hydrazide are for example, formic hydrazide, acethydrazide, benzhydrazide, adipic acid dihydrazide, carbohydrazide, butanohydrazide, hexanoic hydrazide, octanoic hydrazide, oxamic acid hydrazide, maleic hydrazide, N-methylhydrazinecarboxamide, and semicarbazide.

Carbazate (or hydrazinocarboxylate) (e.g., ROC(O)NHNHR' and $ROC(O)NHNH_2$ and ROC(O)NHNHC(O)OR) where one or both nitrogen atoms are substituted by an ester group of formula ROC(O), where each R is independently selected from hydrogen and a hydrocarbon group, and one or both nitrogen atoms are optionally mono- or di-substituted with R', where each R' is an independently selected hydrocarbon group. Illustrative examples of carbazate are for example, methyl carbazate (methyl hydrazinocarboxylate), ethyl carbazate, butyl carbazate, benzyl carbazate, and 2-hydroxyethyl carbazate.

Sulfonohydrazide (e.g., $RSO_2NHNH_2$, $RSO_2NHNHR'$, and $RSO_2NHNHSO_2R$) where one or both nitrogen atoms are substituted by a sulfonyl group of formula $RSO_2$, where each R is independently selected from hydrogen and a hydrocarbon group, and one or both nitrogen atoms are optionally mono- or di-substituted with R', where each R' is an independently selected hydrocarbon group. Illustrative examples of sulfonohydrazide are for example, methanesulfonohydrazide, benzenesulfonohydrazine, 2,4,6-trimethylbenzenesulfonohydrazide, and p-toluenesulfonohydrazide.

Other representative hydrazine compounds are for example hydrazine acetate, aminoguanidine, thiosemicarbazide, methyl hydrazinecarbimidothiolate, and thiocarbohydrazide.

Unless otherwise indicated, in identifying the substituents for R and R' of the various hydrazine compounds, the phrase "hydrocarbon group" encompasses both unsubstituted hydrocarbon groups and substituted hydrocarbon groups. Unsubstituted hydrocarbon groups may be for example a straight chain alkyl group, a branched alkyl group, a cycloalkyl group, an aryl group, an alkylaryl group, and an arylalkyl group. Exemplary alkyl groups include for example methyl, ethyl, propyl, butyl, pentyl, hexyl, heptyl, octyl, nonyl, decyl, undecyl, dodecyl, tridecyl, tetradecyl, pentadecyl, cyclopentyl, cyclohexyl, cycloheptyl, and isomeric forms thereof. Substituted hydrocarbon groups may be the unsubstituted hydrocarbon groups described herein which are substituted one, two or more times with for example a halogen (chlorine, bromine, fluorine, and iodine), nitro, cyano, an alkoxy group (e.g., methoxyl, ethoxyl, and propoxy), or a mixture thereof. In embodiments, the hydrocarbon group may be optionally substituted alkyl and optionally substituted aryl.

In embodiments, the hydrazine compound is other than a hydrazine and a hydrazine salt; in other embodiments, the hydrazine compound is other than a hydrazide; and in further embodiments, the hydrazine compound is other than a hydrazine, a hydrazine salt, and a hydrazide.

One, two, three or more reducing agents may be used. In embodiments where two or more reducing agents are used, each reducing agent may be present at any suitable weight ratio or molar ratio such as for example from about 99(first reducing agent):1(second reducing agent) to about 1(first reducing agent):99(second reducing agent). The amount of reducing agent used in the embodiments of the present invention is for example about 0.25 molar equivalent or more per mole of silver salt.

Any suitable stabilizer may be used which has the function of minimizing or preventing the silver-containing nanoparticles from aggregation in a liquid and optionally providing the solubility or dispersibility of silver-containing nanoparticles in a liquid. In addition, the stabilizer is thermally removable which means that the stabilizer can be caused to dissociate from the silver-containing nanoparticle surface under certain conditions such as through heating. The heating may be accomplished to a certain temperature such as for example below about 250 degree C., or below about 200 degree C., under normal atmospheric conditions or at a reduced pressure of for example from several mbars to about $10^{-3}$ mbar. The thermal dissociation of the stabilizer from the silver-containing nanoparticles at a temperature such as for example lower than about 250 degree C. may result in the evaporation of the stabilizer or decomposition of the stabilizer into gaseous forms.

In embodiments, the stabilizer may be an organic stabilizer. The term "organic" in "organic stabilizer" refers to the presence of carbon atom(s), but the organic stabilizer may include one or more non-metal heteroatoms such as nitrogen, oxygen, sulfur, silicon, halogen, and the like. Exemplary organic stabilizers include for instance thiol and its derivatives, amine and its derivatives, carboxylic acid and its carboxylate derivatives, polyethylene glycols, and other organic surfactants. In embodiments, the organic stabilizer is selected from the group consisting of a thiol such as for example butanethiol, pentanethiol, hexanethiol, heptanethiol, octanethiol, decanethiol, and dodecanethiol; an amine such as for example ethylamine, propylamine, butylamine, penylamine, hexylamine, heptylamine, octylamine, nonylamine, decylamine, and dodecylamine; a dithiol such as for example 1,2-ethanedithiol, 1,3-propanedithiol, and 1,4-butanedithiol; a diamine such as for example ethylenediamine, 1,3-diaminopropane, 1,4-diaminobutane; a mixture of a thiol and a dithiol; and a mixture of an amine and a diamine. Organic stabilizers containing a pyridine derivative (e.g., dodecyl pyridine) and/or organophosphine that can stabilize silver-containing nanoparticles are also included as a stabilizer in embodiments of the present invention.

In embodiments, the stabilizer is an organoamine such as for example butylamine, pentylamine, hexylamine, heptylamine, octylamine, nonylamine, decylamine, hexadecylamine, undecylamine, dodecylamine, tridecylamine, tetradecylamine, diaminopentane, diaminohexane, diaminoheptane, diaminooctane, diaminononane, diaminodecane, diaminooctane, dipropylamine, dibutylamine, dipentylamine, dihexylamine, diheptylamine, dioctylamine, dinonylamine, didecylamine, methylpropylamine, ethylpropylamine, propylbutylamine, ethylbutylamine, ethylpentylamine, propylpentylamine, butylpentylamine, tributylamine, trihexylamine, and the like, or mixtures thereof.

One, two, three or more stabilizers may be used. In embodiments where two or more stabilizers are used, each stabilizer may be present at any suitable weight ratio or molar ratio such as for example from about 99(first stabilizer):1 (second stabilizer) to about 1(first stabilizer):99(second stabilizer). The amount of the stabilizer used is for example about 1 or more molar equivalents per mole of silver salt, or about 2 or more molar equivalents per mole of silver salt, or about 10 or more molar equivalents per mole of silver salt, or about 25 or more molar equivalents per mole of silver salt.

In embodiments, the silver-containing nanoparticles may form a chemical bond with the stabilizer. The chemical names of the stabilizer provided herein are before formation of any chemical bond with the silver-containing nanoparticles. It is noted that the nature of the stabilizer may change with the formation of a chemical bond, but for convenience the chemical name prior to formation of the chemical bond is used.

The attractive force between the silver-containing nanoparticles and the stabilizer can be a chemical bond and/or physical attachment. The chemical bond can take the form of for example covalent bonding, hydrogen bonding, coordination complex bonding, or ionic bonding, or a mixture of different chemical bondings. The physical attachment can take the form of for example van der Waals' forces or dipole-dipole interaction, or a mixture of different physical attachments.

The extent of the coverage of stabilizer on the surface of the silver-containing nanoparticles can vary for example from partial to full coverage depending for instance on the capability of the stabilizer to stabilize the silver-containing nanoparticles in the solvent. Of course, there is variability as well in the extent of coverage of the stabilizer among the individual silver-containing nanoparticles.

Any suitable solvent can be used for the reaction mixture including for example organic solvents and/or water. The organic solvents include for example hydrocarbon solvents such as pentane, hexane, cyclohexane, heptane, octane, nonane, decane, undecane, dodecane, tridecane, tetradecane, toluene, xylene, mesitylene, and the like; alcohols such as methanol, ethanol, propanol, butanol, pentanol and the like; tetrahydrofuran; chlorobenzene; dichlorobenzene; trichlorobenzene; nitrobenzene; cyanobenzene; acetonitrile; and mixtures thereof. One, two, three or more solvents may be used. In embodiments where two or more solvents are used, each solvent may be present at any suitable volume ratio or molar ratio such as for example from about 99(first solvent): 1(second solvent) to about 1(first solvent):99(second solvent).

The reaction of the silver salt with the reducing agent is carried out at a suitable temperature of for example from about −50° C. to about 200° C., or from about 0° C. to about 150° C., particularly at a temperature ranging for example from about 20° C. to about 120° C.

The silver-containing nanoparticles have an average particle size of for example less than about 1000 nm, less than about 100 nm, less than about 50 nm, or less than about 10 nm. The particle size is defined herein as the average diameter of silver-containing particle core, excluding the stabilizer, as determined by transmission electron microscopy ("TEM"). Generally, a plurality of particle sizes may exist in the silver-containing nanoparticles obtained from the preparation. In embodiments, the existence of different sized silver-containing nanoparticles is acceptable.

In embodiments, the silver-containing nanoparticles are composed of elemental silver or a silver composite. Besides silver, the silver composite includes either or both of (i) one or more other metals and (ii) one or more non-metals. Suitable other metals include for example Al, Au, Pt, Pd, Cu, Co, Cr, In, and Ni, particularly the transition metals for example Au, Pt, Pd, Cu, Cr, Ni, and mixtures thereof. Exemplary metal composites are Au—Ag, Ag—Cu, Au—Ag—Cu, and Au—Ag—Pd. Suitable non-metals in the metal composite include for example Si, C, indium tin oxide (ITO), $SiO_2$, $Ag_2O$, AgO, and Ge. The various components of the silver composite may be present in an amount ranging for example from about 0.01% to about 99.9% by weight, particularly from about 10% to about 90% by weight. In embodiments, the silver composite is a metal alloy composed of silver and one, two or more other metals, with silver comprising for example at least about 20% of the nanoparticles by weight, particularly greater than about 50% of the nanoparticles by weight. Unless otherwise noted, the weight percentages recited herein for the components of the silver-containing nanoparticles do not include the stabilizer.

Silver-containing nanoparticles composed of a silver composite can be made for example by using a mixture of (i) a silver salt (or salts) and (ii) another metal salt (or salts) or another non-metal compound (or compounds) in the reaction. The metal salt(s) or the non-metal compound(s) may or may not be reduced by the reducing agent to form silver composite nanoparticles comprising another metal(s) or non-metal(s).

In making the silver-containing nanoparticles, an acid may result from reaction of the anion of the silver salt with a hydrogen ion from the hydrazine compound. This acid is a byproduct (also can be referred to as "residual acid") of the present silver-containing nanoparticle synthesis process. This acid associates with the silver-containing nanoparticles on the surface thereof. The acid may degrade the stability of the silver-containing nanoparticles in a composition. The acid may be for example acetic acid, propionic acid, butyric acid, trifluoroacetic acid, HCl, HBr, HI, $HNO_3$, $HNO_2$, $H_2SO4$, benzoic acid, lactic acid, and the like, or mixtures thereof.

In embodiments, removal of the acid may improve the stability of the silver-containing nanoparticles in a composition. Any suitable method may be used to remove at least a substantial portion of the acid such as for instance: (i) selecting the stabilizer that reacts with the acid; or (ii) adding a base that reacts with the acid; or (iii) both approaches (i) and (ii), wherein for approaches (i), (ii), and (iii), the stabilizer, or the base, or the combination of the stabilizer and the base is present in an amount effective for removing the at least substantial portion of the acid.

For approach (i), any suitable stabilizer that reacts with the acid can be used. In embodiments, the stabilizer is a base such as for example an amine. Representative amines are the organoamines described herein. A large excess amount of the stabilizer may be employed to remove at least a substantial portion of the acid; for instance, the stabilizer may be present in the following illustrative large excess amount: a starting molar ratio in the reaction mixture of the stabilizer to the silver salt ranging from about 5:1 to about 100:1, especially from about 8:1 to about 20:1.

For approach (ii), any suitable base that reacts with the acid may be used (this base may be considered an "additional base" in embodiments where the stabilizer is also considered a base). The base may be an organic base (e.g., sodium methoxide, sodium ethoxide, sodium butoxide, sodium pentoxide, lithium methoxide, lithium ethoxide, lithium butoxide, potassium methoxide, pyridine, dodecylamine, hexadecylamine, oleylamine, triethylamine, tributylamine, and tetramethylethylenediamine (TMEDA)). The base may be an inorganic base (e.g., NaOH, LiOH, KOH, CsOH, $Na_2O$, $Li_2O$, and $K_2O$. The base may be added before, during, or after the addition of the reducing agent. More specifically the base is added after the addition of the reducing agent. The amount of the base used may be from about 1 molar equivalent to about 1000 molar equivalents, or from about 1 molar equivalent to about 100 molar equivalents to the silver salt. The reaction of base with the acid may be carried out at a temperature of from about 0° C. to about 100° C., or from about 20° C. to about 80° C. The reaction time of the base with the acid may be from about one minute to about 240 minutes or from about 5 minutes to about 60 minutes. In embodiments, where the stabilizer is a base, the additional base may be the same or different from the stabilizer.

Another illustrative approach (iv) to accomplish removing at least a substantial portion of the acid is: (iv) extensive washing the separated silver-containing nanoparticles using solvent, which dissolves the acid or its complex with the stabilizer, but does not dissolve or remove (or only minimally dissolves or removes) the stabilizer on the surface of the silver-containing nanoparticles. Representative solvents are, for example, water, methanol, ethanol, acetone, N,N-dimethylformamide (DMF), Dimethylsulfoxide (DMSO), and the like, or mixtures thereof. Approach (iv) can be used alone or in combination with approach (i), or approach (ii), or approach (iii). The "extensive washing" used in approach (iv) is different from the "brief washing" used during the separation of the nanoparticles from the reaction mixture. The purpose of the "brief washing" is to remove impurities from the nanoparticles such as for example the excess stabilizer, residual reducing agent, by-products from the reaction. The "brief washing" is carried out for three or less than three times at room temperature. On the other hand, the purpose of "extensive washing" is to remove the acid or its complex with the stabilizer on the surface of the nanoparticles. In embodiments, the "extensive washing" may be carried out after the "brief washing" for additional one to five times. The "extensive washing" can be carried out at room temperature or at an elevated temperature such as from 35 degrees C. to about 100 degrees C., to facilitate the removal of the acid or its complex with the stabilizer.

The "silver nanoparticles substantially free of acid" herein represents the silver-containing nanoparticles, which contain for example less than about 2 weight percent ("wt %") of acid, or less than about 1 wt % of acid, or less than about 0.1 wt % acid, or less than about 0.01 wt % of acid, based on the weight of the silver-containing nanoparticles with molecules of the stabilizer and the acid on the surface thereof (the phrase "less than" encompasses as the lower limit no detectable amount of acid as well, e.g., 0.00 wt % of acid). The amount of acid present in the silver-containing nanoparticles can be determined by common analytical techniques such as GC-MS or HPLC-MS.

The preparation of silver-containing nanoparticle compositions, which are suitable for the preparation of conductive elements for electronic applications can be carried out using all or some of the following procedures: (i) addition of a scavenger to the final reaction mixture from the preparation of silver-containing nanoparticles to destroy excess reducing agent; (ii) concentrating the reaction mixture by removing solvent; (iii) adding the concentrated reaction mixture to a non-solvent (or vice versa) to precipitate the silver-containing nanoparticles; (iv) collecting the silver-containing nanoparticles by filtration or centrifugation to result in isolated silver-containing nanoparticles (with the stabilizer molecules on the surface of the silver-containing nanoparticles); (v) dissolving or dispersing (assisted by for example ultrasonic and/or mechanical stirring) the isolated silver-containing nanoparticles (with molecules of the stabilizer on the surface of the silver-containing nanoparticles) in an appropriate liquid.

Silver-containing nanoparticle compositions can also be made by mixing silver-containing nanoparticles with other metal or non-metal nanoparticles.

In embodiments, it may be possible to form a silver-containing nanoparticle composition (with stabilizer molecules on the surface of the silver-containing nanoparticles) suitable for forming conductive elements for electronic applications without the need for the above described procedures to isolate the silver-containing nanoparticles from the reaction mixture. In such embodiments, the reaction mixture (optionally augmented with another liquid which may be the same or different from the solvent used in the reaction mixture) may be considered the silver-containing nanoparticle composition.

The scavengers that can be used to destroy excess reducing agent include for example ketone, aldehyde, carboxylic acid, or a mixture thereof. Specific exemplary scavengers include acetone, butanone, pentanone, formaldehyde, acetaldehyde, acetic acid, and the like, or a mixture thereof.

Suitable non-solvents that can be used for the precipitation of silver-containing nanoparticles include any liquids that are mixable with the reaction solvent or solvents for the preparation of silver-containing nanoparticles.

The liquid that can be used to disperse or dissolve silver-containing nanoparticles to form a silver-containing nanoparticle composition includes organic liquids or water. The organic liquids include for example hydrocarbon solvents such as pentane, hexane, cyclohexane, heptane, octane, nonane, decane, undecane, dodecane, tridecane, tetradecane, toluene, xylene, mesitylene, and the like; alcohols such as methanol, ethanol, propanol, butanol and the like; tetrahydrofuran; chlorobenzene; dichlorobenzene; trichlorobenzene; nitrobenzene; cyanobenzene; acetonitrile; and mixtures thereof. One, two, three or more liquids may be used. In embodiments where two or more solvents are used, each solvent may be present at any suitable volume ratio or molar ratio such as for example from about 99(first liquid):1(second liquid) to about 1(first liquid):99(second liquid).

Exemplary amounts of the components of the silver-containing nanoparticle composition are as follows. The silver-containing nanoparticles and the stabilizer are present in an amount ranging for example from about 0.3% to about 90% by weight, or from about 1% to about 70% by weight, the balance being the other components of the composition such as the liquid.

In embodiments, the stabilizer present in the silver-containing nanoparticle composition originated from the reaction mixture for the preparation of silver-containing nanoparticles; no stabilizer is added subsequently for the formation of the silver-containing nanoparticles. In other embodiments, the same or different stabilizer may be added subsequently for the formation of the silver-containing nanoparticles in an amount ranging for example from about 0.3% to about 70% by weight based on the weight of the silver-containing nanoparticle composition.

The silver-containing nanoparticle composition has a stability (that is, the time period where there is minimal precipitation or aggregation of the silver-containing nanoparticles) of for example at least about 10 days, or from about 10 days to about 30 days.

The fabrication of an electrically conductive element from the silver-containing nanoparticle composition ("composition") can be carried out by depositing the composition on a substrate using a liquid deposition technique at any suitable time prior to or subsequent to the formation of other optional layer or layers on the substrate. Thus, liquid deposition of the composition on the substrate can occur either on a substrate or on a substrate already containing layered material (e.g., a semiconductor layer and/or an insulating layer).

The phrase "liquid deposition technique" refers to deposition of a composition using a liquid process such as liquid coating or printing, where the liquid is a solution or a dispersion. The silver-containing nanoparticle composition may be referred to as an ink when printing is used. Illustrative liquid coating processes include for example spin coating, blade coating, rod coating, dip coating, and the like. Illustrative printing techniques include for example lithography or offset printing, gravure, flexography, screen printing, stencil printing, inkjet printing, stamping (such as microcontact printing), and the like. Liquid deposition deposits a layer of the composition having a thickness ranging from about 5 nanometers to about 5 millimeters, preferably from about 10 nanometers to about 1000 micrometers. The deposited silver-containing nanoparticle composition at this stage may or may not exhibit appreciable electrical conductivity.

As used herein, the term "heating" encompasses any technique(s) that can impart sufficient energy to the heated material to cause the desired result such as thermal heating (e.g., a hot plate, an oven, and a burner), infra-red ("IR") radiation, microwave radiation, plasma radiation, or UV radiation, or a combination thereof.

Heating the deposited composition at a temperature of for example below about 250° C., or below about 200° C. or about 150° C., causes the silver-containing nanoparticles to form an electrically conductive layer which is suitable for use as an electrically conductive element in electronic devices. The heating temperature preferably is one that does not cause adverse changes in the properties of previously deposited layer(s) or the substrate (whether single layer substrate or multilayer substrate). The heating is performed for a time ranging from for example about 1 second to about 10 hours, particularly from about 10 seconds to about 1 hour. The heating is performed in air, in an inert atmosphere for example under nitrogen or argon, or in a reducing atmosphere for example under nitrogen containing from about 1 to about 20 percent by volume hydrogen. The heating is performed under normal atmospheric conditions or at a reduced pressure of for example from several mbars to about $10^{-3}$ mbar.

Heating produces a number of effects. Prior to heating, the layer of the deposited silver-containing nanoparticles may be electrically insulating or with very low electrical conductivity, but heating results in an electrically conductive layer composed of annealed silver-containing nanoparticles which increases the conductivity. In embodiments, the annealed silver-containing nanoparticles may be coalesced or partially coalesced silver-containing nanoparticles. In embodiments, it may be possible that in the annealed silver-containing nanoparticles, the silver-containing nanoparticles achieve sufficient particle-to-particle contact to form the electrically conductive layer without coalescence.

Heating may cause separation of the stabilizer and the liquid from the silver-containing nanoparticles in the sense that the stabilizer and the liquid are generally not incorporated into the electrically conductive layer but if present are in residual quantities. In embodiments, heating may decompose a portion of the stabilizer to produce "decomposed stabilizer." Heating may also cause separation of the decomposed stabilizer such that the decomposed stabilizer generally is not incorporated into the electrically conductive layer, but if present is in a residual amount. Separation of the stabilizer, the liquid, and the decomposed stabilizer from the silver-containing nanoparticles may lead to enhanced electrical conductivity of the resulting electrically conductive layer since the presence of these components may reduce the extent of silver-containing nanoparticle to silver-containing nanoparticle contact or coalescence. Separation may occur in any manner such as for example a change in state of matter from a solid or liquid to a gas, e.g., volatilization.

In embodiments, one or more of the stabilizer, decomposed stabilizer, and the liquid is absent from the electrically conductive layer. In embodiments, a residual amount of one or more of the stabilizer, decomposed stabilizer, and the liquid may be present in the electrically conductive layer, where the residual amount does not appreciably affect the conductivity of the electrically conductive layer. In embodiments, the residual amount of one or more of the stabilizer, decomposed stabilizer, and the liquid may decrease the conductivity of the electrically conductive layer but the resulting conductivity is still within the useful range for the intended electronic device. The residual amount of each component may independently range for example of up to about 5% by weight, or less than about 0.5% by weight based on the weight of the electrically conductive layer, depending on the process conditions such as heating temperature and time. When heating causes separation of the stabilizer and/or decomposed stabilizer from the silver-containing nanoparticles, the attractive force between the separated stabilizer/decomposed stabilizer and the silver-containing nanoparticles is severed or diminished. Other techniques such as exposure to UV radiation, microwave radiation, or IR radiation may be used or combined with thermal heating to accelerate the separation of the liquid and the stabilizer (and/or the decomposed stabilizer) from the silver-containing nanoparticles.

In embodiments, after heating, the resulting electrically conductive layer has a thickness ranging for example from about 5 nanometers to about 5 millimeters, preferably from about 10 nanometers to about 1000 nanometers.

The conductivity of the resulting silver-containing element produced by heating the deposited silver-containing nanoparticle composition is for example more than about 0.1 Siemens/centimeter ("S/cm"), more than about 100 S/cm, more than about 500 S/cm, more than about 2,000 S/cm, more than about 5,000 S/cm, more than about 10,000 S/cm, and more than about 20,000 S/cm as measured by four-probe method.

The resulting conductive elements can be used as conductive electrodes, conductive pads, conductive traces, conductive lines, conductive tracks, and the like in electronic devices. The phrase "electronic device" refers to macro-, micro- and nano-electronic devices such as thin film transistor, organic light emitting diodes, RFID tags, photovoltaic, and other electronic devices which require conductive elements or components.

In embodiments, the advantages of the present chemical method for preparing silver-containing nanoparticles are one or more of the following: (i) single phase synthesis (where the silver salt, the stabilizer, and the solvent form a single phase) without the need for a surfactant; (ii) short reaction time; (iii) low reaction temperatures of below about 100° C.; (iv) uniform particle size and narrow particle size distribution; (v) stable silver-containing nanoparticle composition which can be easily processed by liquid deposition techniques; (vi) relatively inexpensive starting materials; and (vii) suitable for large-scale production that would significantly lower the cost of silver-containing nanoparticles.

The invention will now be described in detail with respect to specific exemplary embodiments thereof, it being understood that these examples are intended to be illustrative only and the invention is not intended to be limited to the materials, conditions, or process parameters recited herein. All percentages and parts are by weight unless otherwise indicated. Room temperature refers to a temperature ranging for example from about 20 to about 25 degrees C.

EXAMPLE 1

Adding NaOH to Remove Acid

Silver acetate (1.67 g, 10 mmol) and 1-dodecylamine (4.63 g, 25 mmol) were dissolved in 20 mL toluene and stirred at 55° C. until silver acetate dissolved (about 2-5 min). Phenylhydrazine (0.6 g, 5.5 mmol) solution in toluene (5 mL) was added into above solution drop-wise with vigorous stirring. The solution became dark red-brown color. The solution was stirred at 55° C. for further 5 min. Then 25 mL of 2N NaOH was then added and stirred for 15 min before the solution was cooled to room temperature. The aqueous layer was discarded and the organic layer was added to stirring methanol (200 mL). The precipitate was filtered and washed briefly with acetone once (100 mL) and methanol two times (100 mL×2). The solid was then dried in vacuo for 2 hr at room temperature to give a dark blue solid. Yield: 1.24 g.

A solution of above silver nanoparticles in toluene (15 wt %) was spin coated on glass slides at 1000 rpm for 2 min to give brown thin films of silver nanoparticles, which was heated on a hot plate at 120° C. for 10 min to give shiny mirror-like thin films with thickness of 100-140 nm. The conductivity of the thin films was measured using conventional four-probe technique. The conductivity was $3.0 \times 10^4$ S/cm.

The solution of these silver nanoparticles was stable at room temperature for 21 days.

COMPARATIVE EXAMPLE

Silver acetate (1.67 g, 10 mmol) and 1-dodecylamine (4.63 g, 25 mmol) were dissolved in 20 mL toluene and stirred at 55° C. until silver acetate dissolved (about 2-5 min). Phenylhydrazine (0.6 g, 5.5 mmol) solution in toluene (5 mL) was added into above solution drop-wise with vigorous stirring. The solution became dark red-brown color. The solution was stirred at 55° C. for further 5 min. Then the solution was cooled to room temperature and added dropwise to a mixture of acetone/methanol (150 mL/150 mL). The precipitate was filtered and washed briefly with acetone once (100 mL) and methanol two times (100 mL×2). The solid was then dried in vacuo for 2 hr at room temperature to give a dark blue solid. The solid was then dried in vacuo for 2 hr at room temperature to give a dark blue solid. Yield: 1.33 g.

A solution of above silver nanoparticles in toluene (15 wt %) was spin coated on glass slides at 1000 rpm for 2 min to give brown thin films of silver nanoparticles, which was heated on a hot plate at 120° C. for 10 min to give shiny mirror-like thin films with thickness of 100-140 nm. The conductivity of the thin films was measured using conventional four-probe technique. The conductivity was $1.0$-$3.5 \times 10^4$ S/cm.

Insoluble precipitates formed after the solution of these silver nanoparticles was stored at room temperature for 3 days.

It will be appreciated that various of the above-disclosed and other features and functions, or alternatives thereof, may be desirably combined into many other different systems or applications. Various presently unforeseen or unanticipated alternatives, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position, size, shape, angle, color, or material.

The invention claimed is:

1. A process comprising:
    (a) preparing a reaction mixture comprising a silver salt, a hydrazine compound, a thermally removable stabilizer, and an optional solvent, to form a plurality of silver-containing nanoparticles with molecules of the stabilizer on the surface of the silver-containing nanoparticles, wherein the reaction mixture generates an acid; and
    (b) removing the acid by adding to the reaction mixture a base selected from the group consisting of NaOH, LiOH, KOH, and mixtures thereof, to obtain silver-containing nanoparticles that are substantially free of acid.

2. The process of claim 1, wherein the acid is acetic acid.
3. The process of claim 1, wherein the silver salt is silver acetate.
4. The process of claim 1, wherein the silver-containing nanoparticles are elemental silver.
5. The process of claim 1, further comprising preparing a composition including a liquid and the plurality of silver-containing nanoparticles with the molecules of the stabilizer on the surface of the silver-containing nanoparticles, wherein the composition is stable at room temperature for a time of at least about 10 days.

6. A process comprising:
    (a) preparing a reaction mixture comprising a silver salt, a hydrazine compound, a thermally removable stabilizer, and an optional solvent, to form a plurality of silver-containing nanoparticles with molecules of the stabilizer on the surface of the silver-containing nanoparticles, wherein the reaction mixture generates an acid; and
    (b) removing the acid by adding to the reaction mixture a base that reacts with the acid wherein the base is present in an amount effective for removing the acid to produce silver-containing nanoparticles substantially free of the acid, and wherein the base is selected from the group consisting of NaOH, LiOH, KOH, CsOH, $Na_2O$, $Li_2O$, $K_2O$, and mixtures thereof.

7. The process of claim 6, further comprising preparing a composition including a liquid and the plurality of silver-containing nanoparticles with the molecules of the stabilizer on the surface of the silver-containing nanoparticles, wherein the composition is stable at room temperature for a time of at least about 10 days.

8. The process of claim 6, wherein the acid is acetic acid.
9. The process of claim 6, wherein the silver salt is silver acetate.

10. A process comprising:
    (a) preparing a reaction mixture comprising a silver salt, a hydrazine compound, a thermally removable stabilizer, and an optional solvent;
    (b) heating the reaction mixture to a temperature of from about 20° C. to about 120° C. form a plurality of silver-containing nanoparticles with molecules of the stabilizer on the surface of the silver-containing nanoparticles, wherein the reaction mixture generates an acid;
    (c) adding a base to the reaction mixture to remove the acid and produce silver-containing nanoparticles substantially free of the acid, the base being selected from the group consisting of NaOH, LiOH, KOH, and mixtures thereof, wherein the ratio of the base to the silver salt is from about 1 molar equivalent to about 100 molar equivalents, and wherein the addition of the base to the reaction mixture occurs at a temperature of from about 20° C. to about 80° C. and a period of from about 5 minutes to about 60 minutes;
    (d) cooling the reaction mixture to room temperature; and
    (e) separating the silver-containing nanoparticles from the reaction mixture.

11. The process of claim 10, further comprising preparing a composition including a liquid and the plurality of silver-containing nanoparticles with molecules of the stabilizer on the surface of the silver-containing nanoparticles, wherein the composition is stable at room temperature for a time of at least about 10 days.

12. The process of claim 10, wherein the silver-containing nanoparticles substantially free of the acid includes less than about 1 weight percent of the acid.

13. The process of claim 10, wherein the acid is acetic acid.
14. The process of claim 10, wherein the silver salt is silver acetate.
15. The process of claim 10, wherein the silver-containing nanoparticles are elemental silver.

* * * * *